United States Patent

Genova et al.

[11] Patent Number: 6,150,867
[45] Date of Patent: Nov. 21, 2000

[54] INTEGRATED DEVICE FOR SWITCHING SYSTEMS WITH FILTERED REFERENCE QUANTITIES

[75] Inventors: Angelo Genova, Delia; Giuseppe Cantone, Siracusa; Roberto Gariboldi, Lacchiarella, all of Italy

[73] Assignee: STMicroelectronics, S.r.l., Agrate Brianza, Italy

[21] Appl. No.: 09/130,694

[22] Filed: Aug. 7, 1998

[30] Foreign Application Priority Data

Aug. 7, 1997 [EP] European Pat. Off. .............. 97830415

[51] Int. Cl.$^7$ .................................................. H03K 17/16
[52] U.S. Cl. ........................... 327/379; 327/534; 327/545
[58] Field of Search .................................... 327/379, 382, 327/384, 389, 419, 427, 530, 531, 532, 534, 535, 537, 538, 540, 541, 542, 543, 545, 546, 548

[56] References Cited

U.S. PATENT DOCUMENTS

| | | | |
|---|---|---|---|
| 5,554,954 | 9/1996 | Takahashi | 327/546 |
| 5,801,576 | 9/1998 | Ooishi | 327/530 |
| 5,977,815 | 11/1999 | Scoones et al. | 327/530 |

FOREIGN PATENT DOCUMENTS 0 284 357 A2  9/1988  European Pat. Off. .
0 481 678 A1  4/1992  European Pat. Off. .

*Primary Examiner*—Jeffrey Zweizig
*Attorney, Agent, or Firm*—Theodore E. Galanthay, Esq.; Robert Iannucci, Esq.; Seed IP Law Group, PLLC

[57] ABSTRACT

An integrated device for a switching system is disclosed. The device includes control circuitry for generating at least one switching control signal, reference circuitry for generating at least one reference quantity, a using circuit for using the reference quantity, a circuit for storing the reference quantity, and a switch which, in a first operative condition, connects the reference circuit to the using circuit and to the storage circuit in order to apply the reference quantity thereto. In a second operative condition, the switch disconnects the reference circuit from the using circuit and connects the storage circuit to the using circuit in order to apply the stored reference quantity thereto. Finally, the device includes filtering circuitry for keeping the switch in the second operative condition for a filtering period in accordance with the switching of the control signal.

17 Claims, 4 Drawing Sheets

INTEGRATED DEVICE FOR SWITCHING SYSTEMS WITH FILTERED REFERENCE QUANTITIES

TECHNICAL FIELD

The present invention relates to an integrated device for a switching system and, in particular, to an integrated device for a switching system including a control circuit that generates a switching signal, a reference circuit that generates a reference voltage and a circuit that uses the reference voltage.

BACKGROUND OF THE INVENTION

Switching systems comprising one or more electronic switches which are cut off and made conductive alternately are commonly used in various applications such as, for example, in supply units, in oscillators, in inverters, and the like. The switching of the electronic switches is controlled by means of a suitable device generally produced in integrated form in a single chip of semiconductor material.

During each switching of the electronic switches, interference is generated and is propagated to the control device, for example, by means of a common supply, a substrate of the chip of semiconductor material, or because of capacitive coupling. This switching interference may alter the values of reference quantities (voltages or currents) used within the control device and may cause a malfunction of its internal circuits such as, for example, the activation of parasitic components which cause undesired switching. This problem is experienced in particular in systems with steeply sloping switching edges, for example, in high-voltage (power) switching systems or in low-voltage switching systems operating at a high frequency.

Known control devices use solutions with extremely complex and expensive internal circuitry to prevent this problem. Filtering capacitors with high capacitances (of the order of some nF) are also generally provided, connected externally to the chip of semiconductor material in which the control device is formed; however, these external components increase the cost and size of the switching system.

SUMMARY OF THE INVENTION

An object of the present invention is to overcome the aforementioned drawbacks. To achieve this object, an integrated device for a switching system is proposed that includes circuits to generate a reference signal and circuits to generate a switching control signal. Also included are a storage circuit and a switch. In a first state, the switch couples the reference signal to both the storage circuit and a circuit that uses the reference signal. In a second state, the switch disconnects the reference signal from the circuit that was using it and instead connects the circuit to the storage circuit. Also included in the devices is a filter circuit that keeps the switch in the second condition for a desired time.

The integrated device according to the present invention is easily implemented. In particular, this solution enables the circuits which generate the reference quantities to be more compact so that the dimensions of the integrated device as a whole are kept smaller. Moreover, the structure of the present invention does not require a filtering capacitor outside the integrated device.

Finally, this integrated device is extremely versatile and flexible and can easily be adapted to the most varied requirements of use.

BRIEF DESCRIPTION OF THE DRAWINGS

Further characteristics and advantages of the integrated device according to the present invention will become clear from the following description of various preferred embodiments thereof, given by way of non-limiting example, with reference to the appended drawings.

FIG. 1b shows, in a qualitative time graph, the variation of some electrical quantities of the system of FIG. 1a.

FIG. 2b shows, in a qualitative time graph, the variation of some electrical quantities of the em of FIG. 2a.

DETAILED DESCRIPTION OF THE INVENTION

Figure 1A:
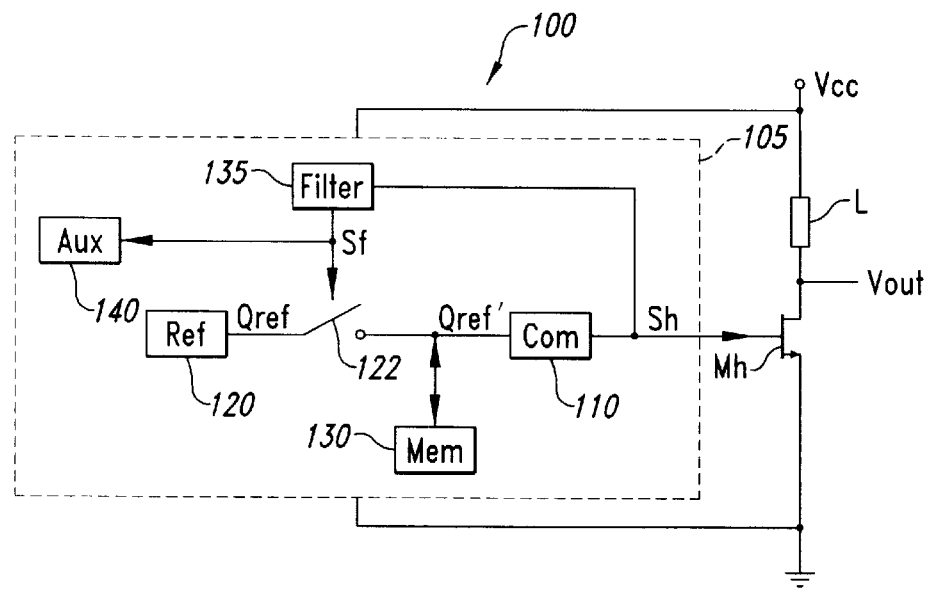
FIG. 1a is a basic block diagram of a switching system comprising the integrated device of the present invention.

With reference in particular to FIG. 1a, this shows a switching system 100 which uses, as an electronic switch, an (N-channel), high-voltage, metal-oxide-silicon field-effect transistor (a MOSFET, or simply MOS) Mh. The transistor Mh has a source terminal connected to a reference terminal (earth) and a drain terminal connected to the first terminal of a load L the second terminal of which is connected to the positive terminal of a supply Vcc. The drain terminal of the transistor Mh is also connected to an output terminal from which a signal Vout is obtained. The integrated device of the present invention can however also be used in different switching systems which include, for example, a low-voltage transistor, a different element as an electronic switch, or two or more switches.

The transistor Mh is controlled by means of a device 105 produced in integrated form in a chip of semiconductor material; the transistor Mh is constituted by a discrete external component or is integrated in the same chip of semiconductor material. The control device 105, which is suitably connected to the supply terminal Vcc and to the earth terminal, includes a block 110 which is connected to a gate terminal of the transistor Mh and generates a switching control signal Sh for the transistor Mh. One or more reference quantities (currents or voltages) Qref, produced by a suitable block 120 are used by the control block 110 or by other circuit elements; the value of the reference quantity Qref is fixed or is programmable, for example, by means of suitable external components (typically resistors). The reference block 120 is connected by means of a switch 122 to the control block 110 and to a block 130 which can store or hold the reference quantity Qref; the storage block 130 preferably comprises a capacitor of limited capacitance (of the order of a few pF) or other charge-storage means. Alternatively, equivalent components are used and, in a closed condition, connect the reference block 120 to the control block 110 and to the storage block 130 and, in an open condition, disconnect the reference block 120 from the control block 110 and connect the storage block 130 to the control block 110. The switch 122 is controlled by means of a suitable filtering signal Sf generated by a block 135 which receives the control signal Sh as an input. The filtering signal Sf is preferably also supplied to a block 140 which performs service functions for the operation of the control device 105.

Figure 1B:
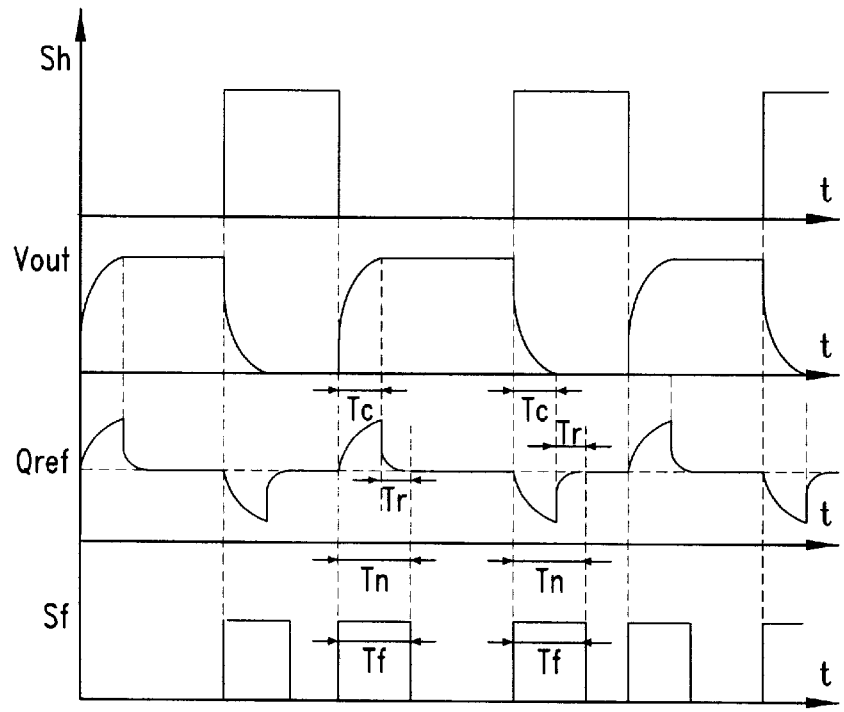

In order to explain the operation of the system of FIG. 1a, reference is made to the qualitative time graph of FIG. 1b which shows the variation, with time (t), of the control signal Sh, of the output signal Vout, of the reference quantity Qref, and of the filtering signal Sf. When the control signal Sh has a low value (for example 0V relative to earth), the transistor Mh is cut off so that the output signal Vout adopts a value equal to the supply voltage Vcc; when the control signal Sh has a high value (for example, 5V), the transistor Mh is conductive so that the output signal Vout adopts a zero value. Upon each switching of the transistor Mh, the output signal Vout is subject to a transitory phenomenon of duration Tc which generates interference of equal duration in the reference quantity Qref. At the end of this transitory switching period, the reference signal Qref returns to its original value after a further transitory resetting period Tr.

The interference in the reference quantity Qref is present only during periods of time which start at a moment which is always known since it coincides with the switching of the control signal Sh; these interference periods have a duration Tn (equal to Tc+Tr in the example in question) which is dependent on the structure of the switching system.

With reference again to FIG. 1a, in the control device 105 according to the present invention, the switch 122 is normally kept closed so that the reference quantity Qref is applied to the control block 110; the same reference quantity Qref is simultaneously stored in the block 130. When the control signal Sh switches (and therefore during each of the interference periods Tn described above), the switch 122 is opened so that the control block 110 is supplied with the reference quantity stored in the block 130, which is not subject to the switching interference since the storage block 130 is disconnected from the block 120 by means of the switch 122 when this interference is present; the control block 110 thus in any case receives as an input a filtered reference quantity Qreef of substantially constant value.

The filtering signal Sf preferably keeps the switch 122 open for a filtering period Tf (FIG. 1b) the start of which coincides with the switching of the control signal Sh. The filtering period Tf has a duration depending on the duration of the interference period Tn, on the degree of precision required, and on the duration of the period in which the reference quantity Qref is used. In general, the filtering period Tf has a duration equal to or greater than the interference period Tn, of the order, for example, of a few $\mu$s. Alternatively, the filtering period Tf has a shorter duration, for example, if very great precision is not required, or if the reference quantity Qref is used only for a short period of time.

The duration of the filtering period Tf advantageously has a single value for all of the reference quantities Qref used in the control device 105 so as to simplify the structure of the control device 105, consequently reducing its size. Alternatively, filtering periods Tf of different durations are provided for each reference quantity Qref so as to ensure greater precision of the control device 105.

In a preferred embodiment of the present invention, the filtering signal Sf is supplied to the service block 140 and is also used for carrying out different operations. For example, the block 140 may contain extinguishing circuitry which switches off the control device 105 when the supply voltage Vcc falls below a predetermined threshold value (under voltage lock-out) or when the temperature of the device exceeds a further threshold value. The operation of the extinguishing circuitry is disabled during the filtering periods Tf so that the switching interference cannot cause undesired switching-off of the control device 105; it should be noted that this solution involves no risk of damage to the control device 105 since it is not necessary for the speed of operation of the extinguishing circuitry to be very high. A different embodiment is constituted by an analog-digital conversion system; in this case, the sampling of the analog signal to be converted is disabled during the filtering periods Tf so as to perform the conversion only when switching interference is not present.

Figure 2A:
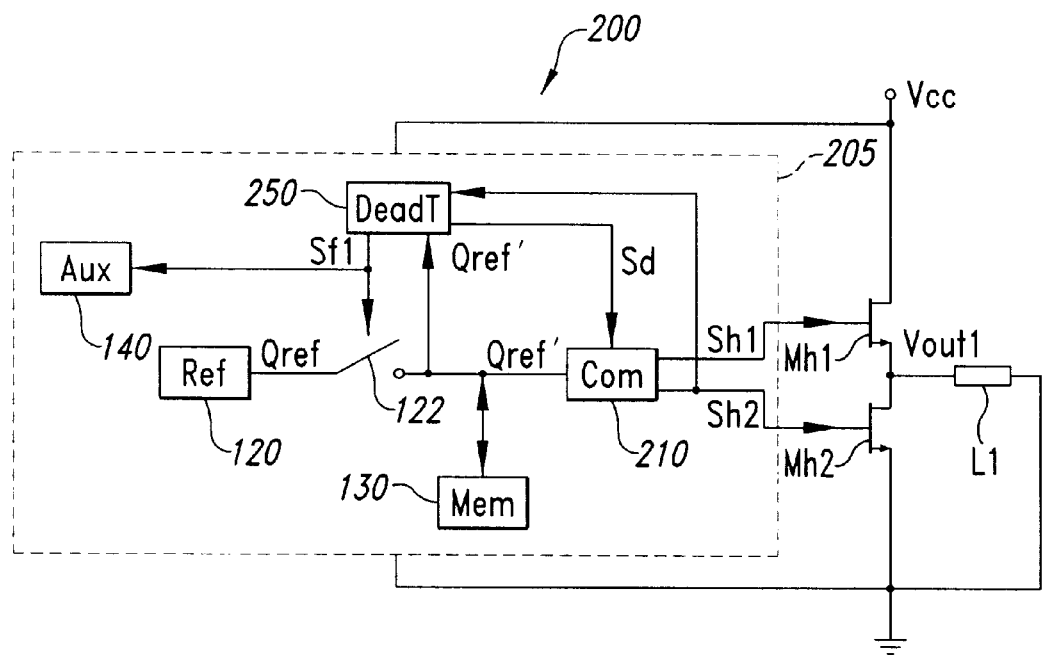
FIG. 2a is a basic block diagram of a switching system comprising a different embodiment of the integrated device of the present invention.

A different embodiment of the present invention is illustrated in FIG. 2a (the elements already shown in FIG. 1a are identified by the same reference numerals or symbols) which shows a switching system 200 which uses, as electronic switches, two (N-channel), high-voltage MOS transistors Mh1 and Mh2 connected as a half-bridge. In particular, a drain terminal of the transistor Mh1 is connected to the supply terminal Vcc and a source terminal of the transistor Mh2 is connected to the earth terminal; a source terminal of the transistor Mh1 and a drain terminal of the transistor Mh2 are connected to the first terminal of a load L1 (from which an output signal Vout1 is obtained), the second terminal of the load L1 being connected to the earth terminal.

The transistors Mh1 and Mh2 are controlled by means of a device 205 (produced in integrated form in a chip of semiconductor material), comprising a block 210 which is connected to a gate terminal of the transistors Mh1 and Mh2, and which generates two switching control signals Sh1 and Sh2 for the transistors Mh1 and Mh2, respectively. A block 250, which receives as inputs one or more filtered reference quantities Qref' and the control signal Sh2, generates a dead time signal Sd; this signal is used by the control block 210 to keep both of the transistors Mh1 and Mh2 cut off for a predetermined period Td (dead time) so as to prevent current peaks in these transistors during the switching stages. The dead time block 250 also generates a filtering signal Sf1 which is used, as in the previous embodiment, by the switch 122 and by the service block 140. This embodiment of the present invention is particularly advantageous since it enables the filtering signal Sf1 to be produced by a simple modification of a pre-existing circuit block, without the need for a suitable filtering block (135 in FIG. 1a).

Figure 2B:
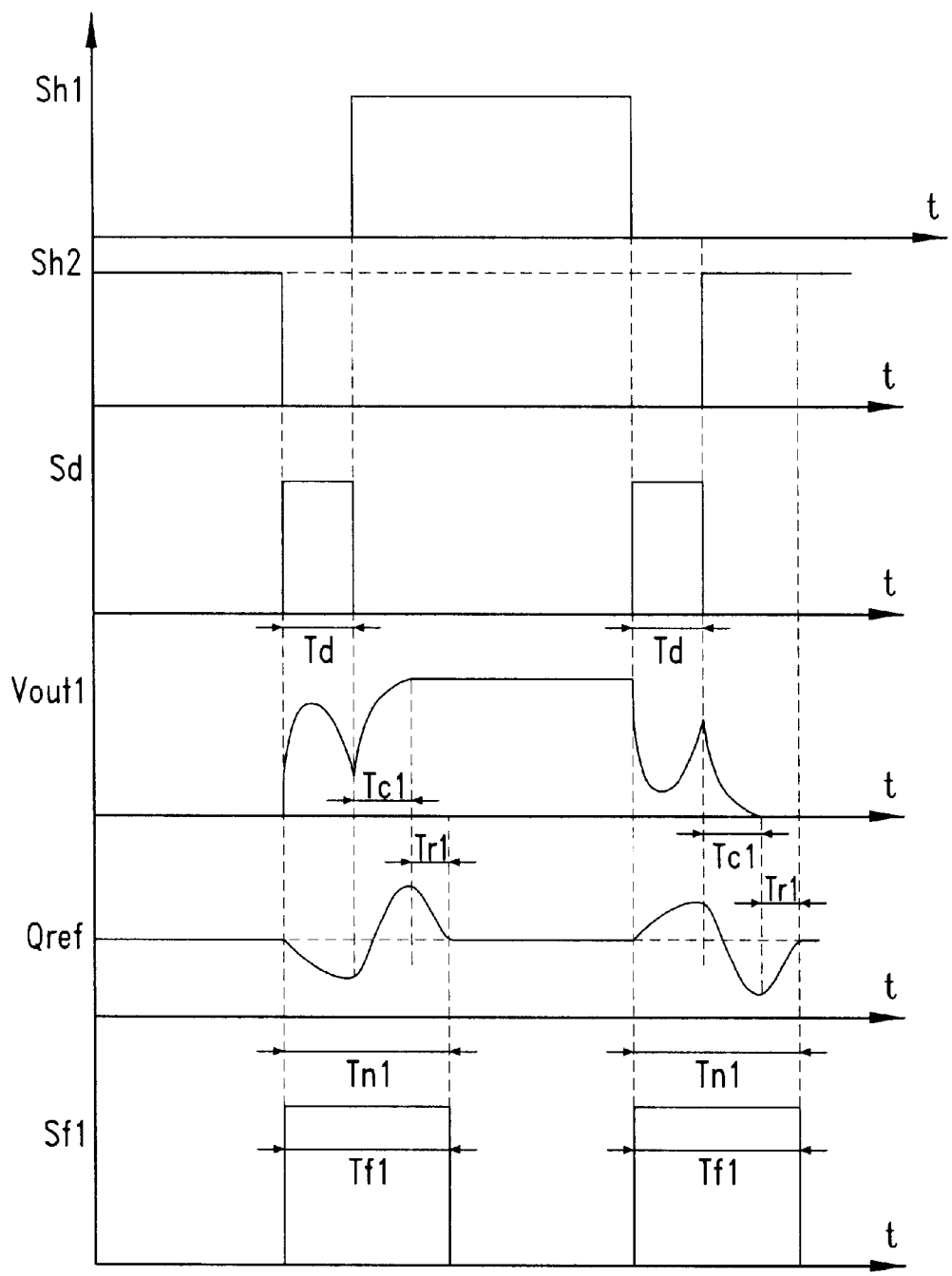

In order to explain the operation of the system of FIG. 2a, reference will be made to the qualitative time graph of FIG. 2b which shows the variation, with time (t), of the control signals Sh1, Sh2, of the dead time signal Sd, of the output signal Vout1, of the reference quantity Qref, and of the filtering signal Sf1. Each switching of the control signal Sh2 from the high value (transistor Mh2 conducting) to the low value (transistor Mh2 cut off) is separated from the corresponding switching of the control signal Sh1 from the low value (transistor Mh1 cut off) to the high value (transistor Mh1 conducting) and vice versa, by the dead time Td. For each switching of the transistors Mh1 and Mh2, the output signal Vout1 is subject to a transitory phenomenon of a duration equal to the sum of the dead time Td and a transitory switching period Tc1 after the dead time. This phenomenon generates, in the reference quantity Qref, interference of equal duration which disappears after a further transitory resetting period Tr1.

In this embodiment, it is preferable to use a filtering period Tf1 the start of which coincides with the start of the dead time Td and the duration of which is, for example, equal to or greater than that of an interference period Tn1=Td+Tc1+Tr1. It should be noted that the reference quantity used to generate the dead time signal Sd provides a typical example of a case in which the reference quantity is used only for a short period of time; the filtering of the reference quantity is required only during the dead time Td so that the respective filtering period Tf1 will have a duration slightly greater than that of the dead time Td.

Figure 3A:
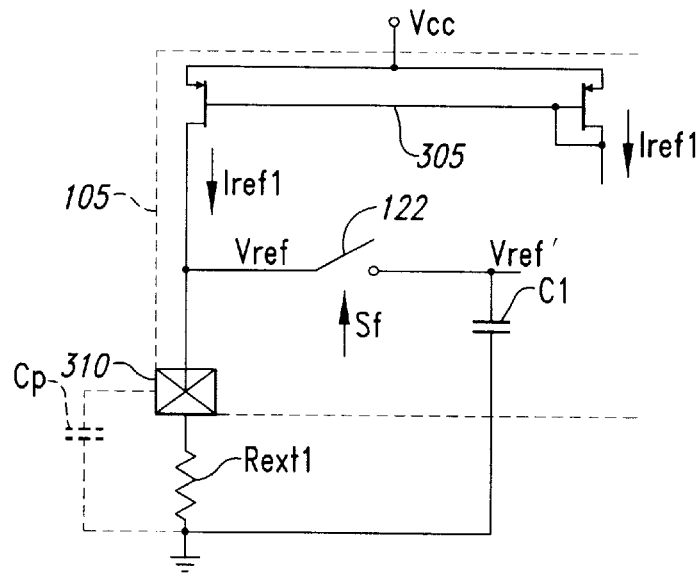
FIGS. 3a and 3b show examples of partial circuit layouts of the integrated device of the present invention.

With reference now to FIG. 3a (the elements already shown in FIG. 1a are identified by the same reference numerals or symbols) this shows an embodiment of a circuit layout for generating a reference voltage. The control device 105 includes a current mirror 305 (connected to the supply terminal Vcc) having a first branch connected to suitable known and conventional circuitry (not shown in the drawing) which generates a reference current Iref1, and a second branch connected to an external pin 310 of the chip in which the control device 105 is formed. The pin 310 is connected to the first terminal of an external resistor Rext1 the second terminal of which is connected to the earth terminal; between the pin 310 and the earth terminal there is also a parasitic capacitor Cp. The pin 310 is connected by means of the switch 122 (which is controlled by the filtering signal Sf) to the first terminal of an internal capacitor C1 the second terminal of which is connected to the earth terminal.

The reference current Iref1 is sent to the pin 310 by means of the current mirror 305 so that, at the terminals of the external resistor Rext1, there is a reference voltage Vref1=Iref1·Rext1, the value of which can be programmed by variation of the resistance of the external resistor Rext1. When the switch 122 is closed, the capacitor C1 is charged to the reference voltage Vref1 and, when the switch 122 is open, the capacitor C1 maintains this voltage value, regardless of switching interference in the reference voltage Vref1. There is therefore a filtered reference voltage Vref1' of substantially constant value at the terminals of the capacitor C1. It should be noted that, in this case, the transitory period for resetting the reference voltage Vref1 (Tr in FIG. 1b) has a duration proportional to the product of the resistance of the external resistor Rext1 and the capacitance of the parasitic capacitor Cp.

Figure 3B:
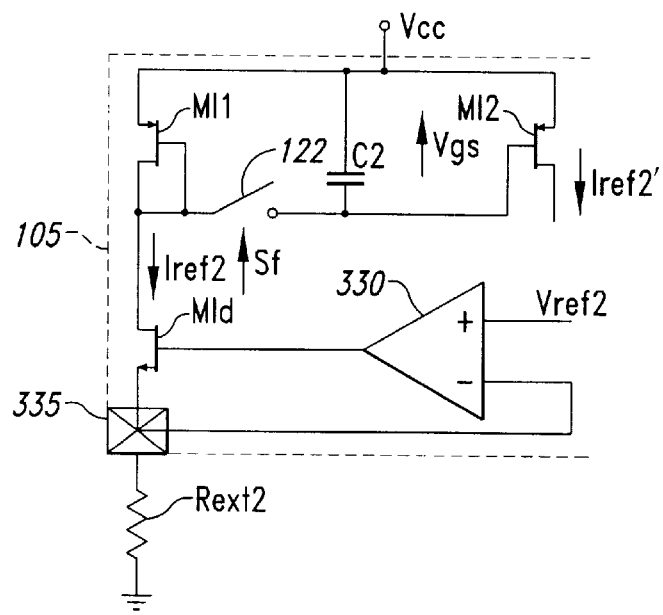

A different embodiment for generating a reference current is illustrated in FIG. 3b (the elements already shown in FIG. 1a are identified by the same reference numerals or symbols). The control device 105 includes an operational amplifier 330 which has a non-inverting input terminal (+) connected to suitable circuitry (not shown in the drawing) which generates a reference voltage Vref2, and an inverting input terminal (−) connected to an external pin 335. The pin 335 is connected to the first terminal of an external resistor Rext2 the second terminal of which is connected to the earth terminal. An (N-channel), low-voltage MOS transistor Mld has a source terminal connected to the pin 335, a gate terminal connected to an output terminal of the operational amplifier 330 and a drain terminal connected to a drain terminal of a (P-channel) low-voltage MOS transistor Ml1. The transistor Ml1 has a gate terminal connected to its own drain terminal and a source terminal connected to the supply terminal Vcc. The device 105 includes a further (P-channel) low-voltage MOS transistor Ml2 having a drain terminal, a gate terminal connected by means of the switch 122 to the gate terminal of the transistor Ml1, and a source terminal connected to the source terminal of the transistor Ml1. An internal capacitor C2 is also connected between the gate terminal and the source terminal of the transistor Ml2.

The reference voltage Vref2 is applied to the pin 335 by means of the operational amplifier 330 which operates as an impedance separator (a buffer); a reference current (of programmable value) Iref2=Vref2/Rext2 thus flows in the resistor Rext2. When the switch 122 is closed, the reference current Iref2 passes through the transistor Mld (connected like a diode) and is sent by means of the current mirror formed by the transistors Ml1 and Ml2, to internal circuitry (not shown in the drawing). In this condition, the capacitor C2 is charged to a voltage Vgs equal to the voltage present between the gate terminal and the source terminal of the transistor Ml2. When the switch 122 is open the capacitor C2 keeps the gate-source voltage of the transistor Ml2 at the same value Vgs so that the current through the transistor Ml2 remains unchanged, regardless of the interference in the reference current Iref2. There is therefore a filtered reference current Iref2' of substantially constant value at the drain terminal of the transistor Ml2.

Naturally, in order to satisfy contingent and specific requirements, a person of ordinary skill in the art may apply to the above-described integrated device many modifications and variations all of which, however, are included in the scope of protection of the invention as defined by the following claims.

What is claimed is:

1. An integrated device for a switching system comprising:

control means for generating at least one switching control signal;

reference means for generating at least one reference quantity;

using means for using the reference quantity;

means for storing the reference quantity;

switch means which, in a first operative condition, connect the reference means to the using means and to the storage means in order to apply the reference quantity thereto and which, in a second operative condition, disconnect the reference means from the using means and thereby allow the reference quantity stored in the storage means to be applied to the using means; and filtering means for keeping the switch means in the second operative condition for a filtering period in accordance with the switching of the control signal.

2. The integrated device according to claim 1, in which the storage means include at least one capacitor.

3. The integrated device according to claim 1, in which the control means generate a single control signal, wherein the filtering period starts upon each switching of the control signal.

4. The integrated device according to claim 1, in which the control means generate a first control signal and a second control signal, and in which the integrated device further includes means for keeping the first control signal and the second control signal simultaneously at an opening value, upon each switching, for a dead time of predetermined duration, the filtering period starting at the beginning of the dead time.

5. The integrated device according to claim 3, in which the filtering period has a duration at least equal to the duration of a period in which there is switching interference in the reference quantity, or at least equal to the duration of a period of use of the reference quantity.

6. The integrated device according to claim 1, in which the reference means generate a plurality of reference quantities, the filtering periods corresponding to each reference quantity being of equal duration.

7. The integrated device according to claim 1, further comprising service means for performing service operations, the service means being connected to the filtering means and being switched off during the filtering periods.

8. The integrated device according to claim 1, comprising means for applying a reference current to an external pin of the integrated device, the pin structured to connect to a reference terminal by means of an external resistor in order to generate a reference voltage, and an internal capacitor having a first terminal for connection to the reference terminal and a second terminal connected to the pin by the switch means so that the internal capacitor maintains, between the first and second terminals, a reference voltage, filtered of switching interference.

9. The integrated device according to claim 1, comprising:

means for applying a reference voltage to an external pin of the integrated device, the pin structured to connect to a first supply terminal by means of an external resistor in order to generate a reference current, means for applying the reference current to a first terminal of a first transistor having a second terminal for connection to a second supply terminal, and a control terminal connected to the first terminal of the first transistor, a second transistor having a first terminal, a control terminal connected by the switch means to the control terminal of the first transistor, and a second terminal connected to the second terminal of the first transistor, and an internal capacitor connected between the control terminal and the second terminal of the second transistor so that the second transistor maintains, at the first terminal, a reference current, filtered of switching interference.

10. A switching system comprising the integrated device according to claim 1 and at least one electronic switch, each electronic switch having a control terminal connected to the control means in order to receive a corresponding switching control signal.

11. An integrated device comprising:

a switching control generating circuit for generating a switching control generation signal;

a reference signal generating circuit for generating a reference signal;

a using circuit that accepts the reference signal;

a storage circuit coupled to the reference signal generating circuit;

a switch coupled to the switching control generating circuit and structured so that in a first state the switch couples the reference signal to the using circuit and to the storage circuit to allow the storage circuit to store a reference quantity of the reference signal, and that in a second state disconnects the reference signal from the using circuit and thereby allows the reference quantity to by applied to the using circuit from the storage circuit; and a filtering circuit coupled to the switch and structured to maintain the switch in one of the states responsive to the switching control generation signal.

12. The integrated device of claim 11 wherein the filtering circuit maintains the switch in the second state for a period at least equal to a period for which there is interference in the reference signal.

13. The integrated device of claim 11 wherein the storage device comprises a capacitor.

14. The integrated device of claim 11 further comprising:

a reference current generating circuit coupled to an external pin of the integrated device;

an external resistor coupled to a reference terminal through a resistor; and a capacitor coupled to the external pin and coupled through the switch to the reference terminal, and for maintaining a reference voltage between the reference terminal and a ground terminal during periods of switching.

15. The integrated device of claim 11 further comprising:

a reference voltage generating circuit coupled to a external pin of the integrated device;

a resistor coupled between the external pin and a reference ground terminal, so that a reference current flows through the external pin;

a circuit structured to apply the reference current to a first and a control terminal of a first transistor, a second terminal of the first transistor coupled to a voltage supply terminal; and a second transistor having a first terminal coupled to the first terminal of the first transistor, and having a control terminal coupled through a capacitor to the control terminal of the first transistor, so that the second transistor maintains the reference current flowing through it that is filtered of switching interference.

16. A method to prevent interference in an output signal during a switching event comprising:

coupling a reference voltage to a signal generating circuit and to a storage circuit during a period of a switch cycle;

storing in the storage circuit a reference quantity reflective of the reference voltage;

generating a switching signal;

sensing the switching signal at a filter circuit; and decoupling the reference voltage from the signal generating circuit and thereby applying the reference quantity from the storage circuit to the signal generating circuit during a time period determined by the filter circuit and responsive to the switching signal.

17. The method of claim 16 further comprising:

generating a second switching signal; and sensing the second switching signal at the filter circuit;

wherein the decoupling step includes decoupling the reference voltage from the signal generating circuit during a time determined by the filter circuit that is at least as long as the time between the first and second switching signal times.

* * * * *